United States Patent [19]

Yakshin et al.

[11] 4,055,842
[45] Oct. 25, 1977

[54] DIGITAL DEVICE FOR MEASURING SINGLE AND MULTIPLE IMPACT IMPULSES

[76] Inventors: Alexandr Sergeevich Yakshin, ulitsa Malaya Filevskaya, 66, kv. 104; Oleg Nikolaevich Novikov, ulitsa Kuznetsky most, 18/7, kv. 6; Dmitry Alexeevich Grechinsky, ulitsa Tolbukhina, 8, korpus 2, kv. 48; Viktor Alexandrovich Klochko, ulitsa Oktyabrskaya, 38, kv. 374; Viktor Georgievich Rygalin, 3-Dorozhny proezd, 5 korpus 2, kv. 103, all of Moscow, U.S.S.R.

[21] Appl. No.: 643,027

[22] Filed: Dec. 22, 1975

[30] Foreign Application Priority Data
Dec. 24, 1974   U.S.S.R. ................................ 2088810

[51] Int. Cl.$^2$ ............................................. H03K 13/02
[52] U.S. Cl. ................................... 340/347 AD; 73/12; 328/115
[58] Field of Search ................ 340/347 AD, 347 NT, 340/15.5 AP; 328/151, 117, 135, 115; 73/12, 556

[56] References Cited

U.S. PATENT DOCUMENTS 3,286,253  11/1966  Leng ............................ 340/347 AD
3,845,397  10/1974  Schulz ............................ 328/151 X Primary Examiner—Thomas J. Sloyan
Attorney, Agent, or Firm—Lackenbach, Lilling & Siegel

[57] ABSTRACT

A digital device for measuring single and multiple impact impulses comprises a unit for measuring the peak value of impact pulses, whose first input is connected to a unit for successive separation of impact pulse time intervals and a pause, whose first and second outputs are connected to the first and second inputs of a unit for separation of the first pulse and a group of further pulses from a train of high-frequency pulses filling the pause, whose third input is connected to the first output of the measuring unit. The second and third outputs of the measuring unit are connected to the first and second inputs of a unit for readout of information on single and multiple impact pulses, whose third input is connected to the first output of the unit for separation of the first pulse and to the second input of the measuring unit. The second output and the fourth input of the unit for separation of the first pulse are respectively connected to the input and the first output of a unit for setting operational modes for measuring single and multiple impact pulses, whose second output is connected to the fourth input of the unit for information readout, which ensures high-speed operation and accurate measurements.

6 Claims, 4 Drawing Figures

DIGITAL DEVICE FOR MEASURING SINGLE AND MULTIPLE IMPACT IMPULSES

This invention relates to devices for measuring parameters of shock overloads and, in particular, to devices for measuring single and multiple impact impulses and, more specifically, for measuring their peak values. Investigations of impact processes relates to currently central problems involving the study of various objects under all types of shock overloads causing internal stresses, strains, breaking of bonds and material shifts.

To estimate the effect of an impact load upon an object it is required to have in particular reliable and documentary information on the peak value of acceleration of an impact pulse.

It is important to obtain such reliable and documentary information on peak values of acceleration of not only single but also multiple impact pulses.

The solution of this problem will be undoubtedly solved in the future by means of digital impact measuring instruments and devices.

The problems of higher levels of accuracy, reliability and documentation of information and measuring of single and multiple impact impulses are to be approached in a more concrete way, that is impact measuring instruments and devices are to be compatible with digit printing equipment, computers and displays, permit measurement of impact pulses in the process of advancing, by permanently ready to measure the next impact pulse and possess a high accuracy of measurement of impact pulse parameters.

Some particular problems arising in practical measurements of impact processes can be solved only by digital impact measuring instruments and devices.

An example of such a problem is the requirement of measuring only the parameters of the first impact pulse from a sequence of impact pulses.

The proposed device for measuring single and multiple impulses satisfies a 11 the aforementioned requirements including the requirement of measuring the parameters of only the first impact pulse from a sequence of impact pulses.

Until recently impact processes were measured by analog equipment ensuring measurement of the peak value of an impact impulse. Obtaining such information involves processing either the impact process of oscillograms or the readings of indicating analog instruments, both of which are certainly not documentary. It should be also noted that indicating analog instruments do not permit measurements of peak values of each pulse from a sequence of impact pulses and recording of this information in an appropriate document.

Employment of analog methods of processing of pulse processes considerably decreases prompt information supply and hampers timely test correction, especially in tests involving new materials and structures (cf. for example, V.S. Pellinets, Measurement of Impact Accelerations, Standards publication, Moscow, 1975, pp. 209 - 210).

There is also a device to measure impact impulses (cf. for example, USSR Author's Certificate No. 227,648, Class 0115/00) where an acceleration pickup converts mechanical vibrations of a test object into electrical signals fed through an amplifier unit to a means for measuring the parameters of an impact process. This device measures the peak value of an impact impulse.

The means for measuring the parameters of an impact impulse in the aforementioned device is made as an analog voltage measurer comprising an electrical stage and an oscillograph and measuring is done by comparing the pulse recorded on the oscillograph screen with the pulse of an additional pulse generator.

As a result the aforementioned device cannot measure multiple impact pulses.

As it has been mentioned before, it is advisable that all measurements are done while an impact pulse is advancing to obtain information on the parameters of multiple impact pulses. In this connection it is desirable to employ such digital impact measuring devices which use for measurements the principle of digit weiighting of the analog-to-digit conversion method described, for example, in the U.S. Pat. No. 3,286,253, cl 340 - 347.

This digital device for measuring single and multiple impact pulses comprises a converter of impact impulses into an electrical signal, which is electrically coupled via an amplifier and an electrical signal filter to the input of a unit for measuring the peak value of impact pulses consisting of two coupled respective inputs of two tens and units comparators of this meausring unit, their outputs together with an output of a base frequency generator being electrically connected by means of gate means to the inputs of the tens and units registers of the measuring unit, having a reset line, their outputs being in their turn electrically connected to inputs of a digital-analog converter, its output being connected to other inputs of the tens and units comparators.

This device is a low-speed operating device due to the absence of a control circuit. High accuracy of measurements is therefore unobtainable.

This invention is concerned with providing a digital device for measuring single and multiple impact impulses characterized by a high accuracy of measurement.

Another object of this invention is to increase the speed of operation of a digital device for measuring single and multiple impulses.

These objects are achieved by providing a digital device for measuring single and multiple impact impulses which comprises a converter which converts impact impulses into electrical signals and which is electrically connected via an amplifier and an electrical signal filter to an input of a unit for measuring the peak value of impact pulses, the input being composed of the respective inputs of a tens and an units comparators of this measuring unit, whose outputs together with outputs of a base frequency generator being electrically connected by means of gates to inputs of a tens and an units registers of the measuring unit which have a reset line, and whose outputs are in their turn electrically connected to inputs of a digital-analog converter, whose output is connected to other inputs of the first set of tens and units comparators. There are, according to the invention, also provided a unit for successive separation of impact pulse time intervals and a pause, its input being connected to said input of the unit for measuring the peak value of impact pulses; a unit for separation of the first pulse and a group of further pulses from a train of high-frequency pulses filling a pause, its first and second inputs being connected to the first and second outputs of the unit for successive separation of impact pulses time intervals and a pause, and its third input being connected to the first output of the measuring unit, which is one of the outputs of the base frequency generator; a unit for readout of information on single and multiple impact pulses, its first and second inputs being connected to the second and third output of the measuring unit, which are inputs of the second set of tens and units registers respectively, and its third input being connected to the first output of the unit for separation of a first pulse and a group of further pulses from a train of high-frequency pulses filling a pause and to the second input of the measuring unit, which is a reset line; and a unit for setting operational modes for measuring single and multiple impact pulses, its input being connected to the second output and its first output to the fourth input of the unit for separation of a first pulse and a group of further pulses from a train of high-frequency pulses filling a pause, and the second output of the mode setting unit being connected to the fourth input of the information readout unit.

It is advisable that the unit for successive separation of impact pulse time intervals and a pause comprise a zero device, its one input being the input of said unit and a base voltage being applied to the other input; a pulse generator, its input being connected to the output of the zero device and the output being the second output of said unit; a NOT gate, its input being connected to the output of the pulse generator and the output being the first output of said unit.

It is wise that the unit for separation of the first pulse and a group of further pulses from a train of high-frequency pulses filling a pause comprise a first AND NOT gate, its one input being the second input of said unit; a first AND gate, its one input being the first input of said unit and the other input being connected to another input of the first AND NOT gate and being the third input of said unit; a flip-flop, its adjustment input being connected to an output of the first AND NOT gate and the dynamic input being connected to the output of the first AND gate; a second AND gate, its one input being connected to the inverting output of the flip-flop, another input to the output of the first AND gate and the output being the second output of said unit; a second AND NOT gate, its one input being connected to the output of the flip-flop, another input to the output of the first AND gate, one more input being the fourth input of said unit and the output being the first output of said unit.

It is expedient that the unit for readout of information on single and multiple impact pulses comprise a tens and an units counting decades, their counting inputs being the first and the second inputs of said unit, and their coupled reset inputs being the third input of said unit and a tens and an units registers, their inputs being connected to the respective outputs of the tens and units counting decades and their transcription inputs being coupled and serving as the fourth input of said unit.

It is also advisable that the unit for setting operational modes for measuring single and multiple impact pulses comprise a flip-flop; its dynamic input being the input of said unit, an AND gate; its one input being connected to the dynamic input of the flip-flop and the output being the second output of said unit, a multivibrator and two normally open contacts, one of them being an electrical connection between the output of the multivibrator and the adjustment input of the flip-flop and the second being an electrical connection between the flip-flop and another input of the AND gate serving as the first output of said unit.

With the proposed digital device for measuring single and multiple impact impulses the preparation for measuring each next impact impulse is done within the pause and actual measurement of pulse parameters is done while they are advancing, which ensures high-speed operation and accuracy of measurement due to the fact that preparation has no effect on measurements during the pulse advance. Introduction of a memory unit permits high-speed transfer of information on the peak value of impact impulses to various indication units, digit printing devices and computers.

The invention will now be described in greater detail with reference to a specific embodiment thereof, taken in conjunction with the accompanying drawings, wherein.

Figure 1:
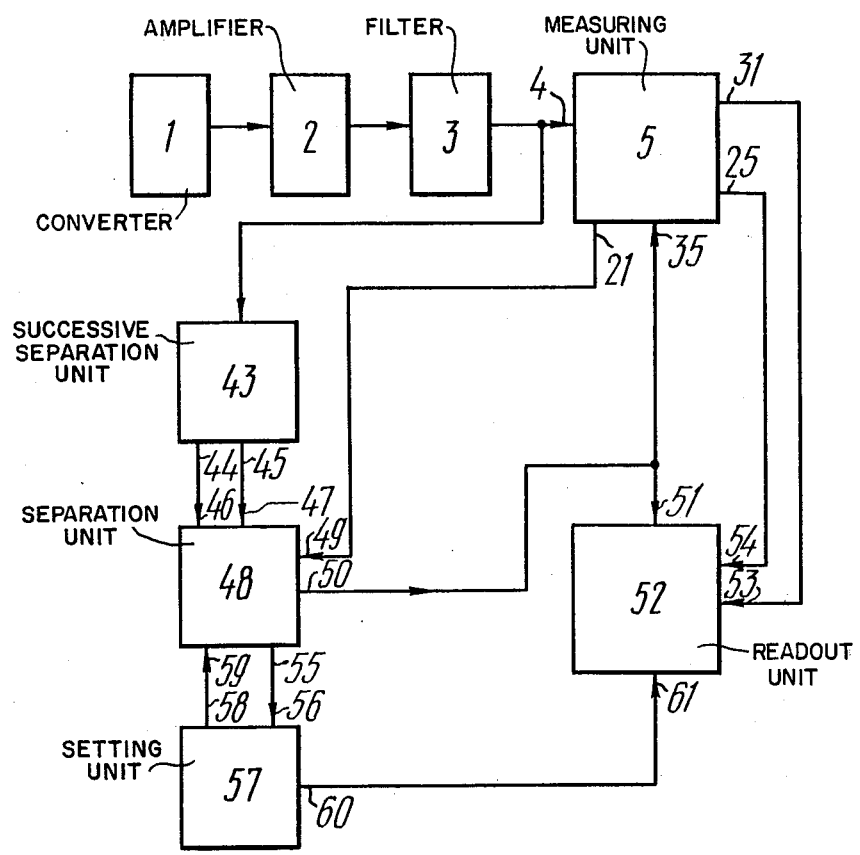
FIG. 1 is a block diagram of the proposed digital device for measuring single and multiple impact impulses, according to the invention.

The proposed device for measuring single and multiple impact impulses comprises a converter 1 (FIG. 1) of impact impulses into an electrical signal, its output being electrically connected via an amplifier 2 and a filter 3 to an input 4 of a unit 5 for measuring the peak value of an impact pulse. The input 4 forms respective inputs 6 (FIG. 2) and 7 of a tens comparator 8 and a units compartor 9 which are a part of the circuit of the unit 5. An output of the tens comparator 8 is connected to an input 10 of an AND gate 11 of the measuringg unit 5 and to an inverting input 12 of an INHIBIT gate 13 of the measuring unit 5. The output of the units comparator 9 is coupled to an input 14 of the INHIBIT gate.

A base frequency generator 15 of the unit 5 is connected by its output 16 to an input 17 of the AND gate 11 and by its output 18 to an input 19 of an AND gate 20 of the measuring unit 5, the output 18 serving as a first output 21 of the unit 5 for measuring the peak value of an impact pulse.

The output of the INHIBIT gate 13 is connected to an input 22 of the AND gate 20, whose output is connected to an input 23 of a units register 24, which is a part of the circuit of the measuring unit 5, and at the same time is a third output 25 of the unit 5 for measuring the peak value of an impact pulse. An output 26 of the units register 24 is connected to the input of an OR gate 27 of the measuring unit 5, and an input 28 of said OR gate 27 is connected to the output of the AND gate 11.

The output of the OR gate 27 is connected to an input 29 of a tens register 30, which is a part of the measuring unit 5, and at the same time serves as a second output 31 of the unit 5 for measuring the peak value of an impact pulse.

Reset inputs 32 and 33 of the tens register 30 and the units register 24 respectively are coupled by a common reset line which serves as a second input 35 of the unit 5 for measuring the peak value of an impact pulse.

Outputs 36 and 37 of the tens register 30 and the units register 24 are respectively coupled to inputs 38 and 39 of a digital-analog converter 40 of the measuring unit 5. The output of the digital-analog converter 40 is connected to inputs 41 and 42 of the tens comparator 8 and the units comparator 9 respectively.

The device also comprises a unit 43 (FIG. 1) for successive separation of impact pulse time intervals and a pause, its input being connected to the input 4 of the unit 5 for measuring the peak value of impact pulses, and a first output 44 and a second output 45 being respectively coupled to a first input 46 and a second input 47 of a unit 48 for separation of the first pulse and a group of further pulses from a train of high-frequency pulses filling a pause. A third input 49 of the separation unit 48 is connected to the first output 21 of the measuring unit 5.

A first output 50 of the separation unit 48 is connected to the second input 35 of the measuring unit 5 and to a third input 51 of a unit 52 for readout of information on single and multiple impact pulses. A first input 53 and a second input 54 of the readout unit 52 are respectively connected to the second output 31 and the third output 25 of the measuring unit 5.

A second output 55 of the separation unit 48 is connected to an input 56 of a unit 57 for setting operational modes for measuring single and multiple impact pulses, whose first output 58 is connected to a fourth input 59 of the separation unit 48 and whose a second output 60 is coupled to a fourth input 61 of the readout unit 52.

A digital device for measuring single and multiple pulses comprises the unit 43 for successive separation of impact pulse time intervals and a pause composed of a zero device 62, whose input 63 is the input of the separation unit 43, and a base voltage source 64, whose output is connected to an input 65 of the zero device 62. The separation unit 43 also comprises a pulse generator 66, whose input is connected to the output of the zero device 62, and a NOT gate 67, whose input is connected to the output of the pulse generator 66.

Outputs of the pulse generator 66 and the NOT gate 67 are respectively the second output 45 and the first output 44 of the unit 43 for successive separation of impact pulse time intervals and a pause.

A digital device for measuring single and multiple impact impulses also comprises the unit 48 for separation of a first pulse and a group of further pulses from a train of high-frequency pulses filling a pause composed of: a first NAND gate 68, its input 69 being the second input 47 of said separation unit 48; as well as a first AND gate 70, its input 71 being the first input 46 of said separation unit 48. Another input 72 of the AND gate 70 is connected to another input 73 of the first NAND gate 68 and serves as the third input 49 of said separation unit 48.

The separation unit 48 comprises a flip-flop 74, its adjustment input 75 being connected to the output of the first NAND gate 68, and its dynamic input 76 being connected to the output of the first AND gate 70. The unit 48 also comprises a second AND gate 77, its input 78 being connected to an output 79 of the flip-flop 74, its input 80 being connected to the output of the first AND gate 70 and its output being the second output 55 of said separation unit 48; a second NAND gate 81, its input 82 being connected to an output 83 of the flip-flop 74, its input 84 being connected to the inverting output of the first AND gate 70, another input being the fourth input 59 of said separation unit 48 and its output being the first output 50 of the separation unit 48.

A digital device for measuring single and multiple impact pulses also comprises the unit 52 for readout of information on single and multiple impact pulses made up of a tens counting decade 86 and a units counting decade 87, their counting inputs 88 and 89 being the first input 53 and the second input 54 respectively of the readout unit 52, their reset inputs 90 and 91, which are coupled together, are the third input 51 of said readout unit 52. The readout unit 52 comprises also a tens register 92 and a units register 93, their transcription inputs 94 and 95 are coupled and serve as the fourth input 61 of the readout unit 52, and inputs 96 and 97 are connected respectively to outputs 98 and 99 of the tens counting decade 86 and the units counting decade 87.

A digital device for measuring single and multiple impact pulses also comprises the unit 57 for setting operational modes for measuring single and multiple impact pulses composed of a flip-flop 100, its dynamic input 101 being the input 56 of said setting unit 57, and an AND gate 102, its input 103 being connected to the dynamic input 101 of the flip-flop 100 and the output being the second output 60 of the setting unit 57. The setting unit 57 also comprises a multivibrator 104 and two normally open contacts 105 and 106, the normally open contact 105 being the electrical connection between the output of the multivibrator 104 and an adjustment input 107 of the flip-flop 100 and the normally open contact 106 being the electrical connection of an output 108 of the flip-flop 100 and another input 109 of the AND gate 102, which serves as the first output 58 of said setting unit 57.

In this embodiment of a digital device for measuring single and multiple impact pulses the unit 43 for successive separation of impact pulse time intervals and a pause uses a base voltage source 64 made as a voltage divider employing resistors 110 (FIG. 3) and 111. The common point of the voltage divider is connected to the inverting input of an operational amplifier employed by the zero device 62, its non-inverting input being the input of the separation unit 43.

The output of the operational amplifier is coupled to a resistor 112 which is the input of the pulse generator 66. The pulse generator 66 uses two transistors 112 and 114, their base circuits including resistors 112 and 115 respectively and their collector circuits including resistors 116 and 117 respectively. The resistor 115 electrically connects also the base of the transistor 114 to the collector of the transistor 113.

In this embodiment of the unit 48 for separation of a first pulse and a group of further pulses from a train of high-frequency pulses filling a pause the flip-flop 74 has a R input 75 and a C input 76.

In this embodiment of the unit 57 for setting operational modes of single and multiple impact pulses the flip-flop 100 has an adjustment R input 107 and a dynamic C input 101.

The multivibrator 104 of the setting unit 57 uses three series-connected NOT gates 118, 119 and 120, the output of the NOT gate 119 being connected to the input of the NOT gate 118 via a condenser 121, the output of the NOT gate 120 being the output of the multivibrator 104 and being connected to the input of the NOT gate 118 via a resistor 122.

In this embodiment of the unit 52 for readout of information on single and multiple impact pulses the tens register 92 and the units register 93 each use four flip-flops 123, 124, 125 and 126 and 127, 128, 129 and 130 respectively. C inputs of the flip-flops 123, 124, 125 and 126 of the tens register 92 are coupled to each other and constitute the transcription input 94 of said register 92.

C inputs of the flip-flops 127, 128, 129 and 130 of the units register 93 are also coupled to each other and constitute the transcription input 95 of the units register 93.

D-inputs of the flip-flops 123 – 126 which are the inputs 96 of the register 92, are connected to the outputs of the flip-flops 131, 132, 133, 134 respectively constituting the tens counting decade 86, said outputs of the flip-flops 131–134 being at the same time the outputs 98 of said counting decade 86.

D-inputs of the flip-flops 127 – 130, which are the inputs 97 of the register 93, are connected to the outputs of the flip-flops 135, 136, 137 and 138 respectively constituting the units counting decade 87 said outputs of the flip-flops 135–138 being at the same time the outputs 99 of said counting decade 87.

R-inputs of the flip-flops 131 – 134 are united and are the reset input 90 of the counting decade 86. R-inputs of the flip-flops 135 –138 are also united and are the reset input 91 of the counting decade 87.

The C-input of the flip-flop 131 of the counting decade 86 is the input 88 of said counting decade 86, whereas the C-input of the flip-flop 135 of the counting decade 87 is the input 89 of said counting decade 87.

The tens counting decade 86 comprises, apart from the flip-flops 131 –134, two AND gates 139 and 140, and the units counting decade 87 comprises, apart from the flip-flops 135 –138, two AND gates 141 and 142.

The inverting output of the flip-flop 131 of the counting decade 86 is connected to the C-input of the flip-flop 132, the C-input of the flip-flop 134 and the D-input of the flip-flop 131. The inverting output of the flip-flop 132 is connected to the C-input of the flip-flop 133 and to an input 143 of the AND gate 139, whose output is connected to the D-input of the flip-flop 132. The output of the flip-flop 132 is connected to the input 144 of the AND gate 140. The inverting output of the flip-flop 133 is connected to the D-input of said flip-flop 133, whereas the output of the flip-flop 133 is connected to an input 145 of the AND gate 140, whose output is connected to the D-input of the flip-flop 134. The inverting output of the flip-flop 134 is connected to an input 146 of the AND gate 139.

The flip-flops 135 –138 and the AND gates 141, 142 of the units counting decade 87 are electrically coupled to each other similarly to the way the flip-flops 131 – 134 are connected to the AND gates 139, 140 of the tens counting decade 86.

Figure 2:
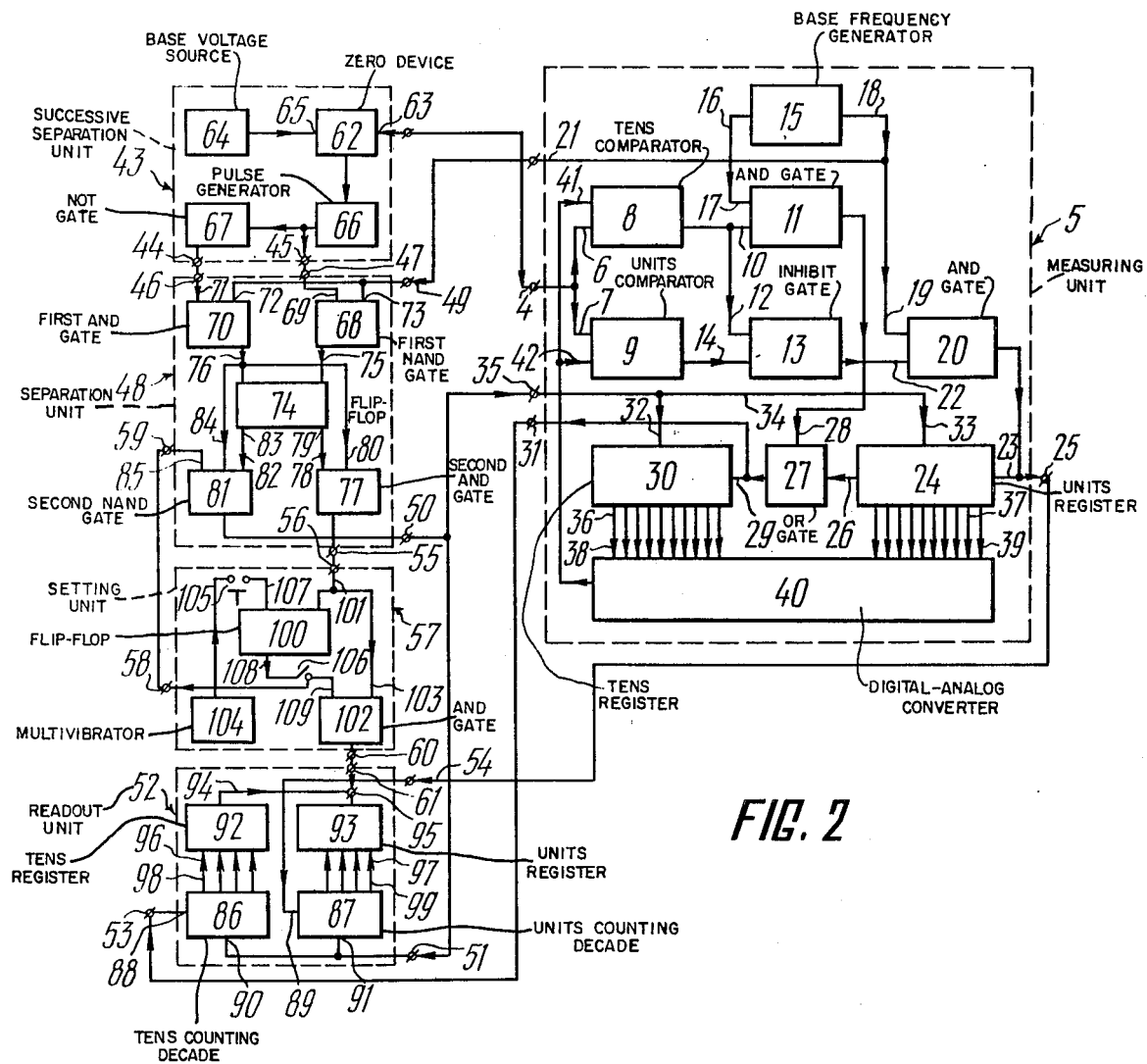
FIG. 2 is a detailed block diagram of the proposed device, according to the invention.
Figure 3:
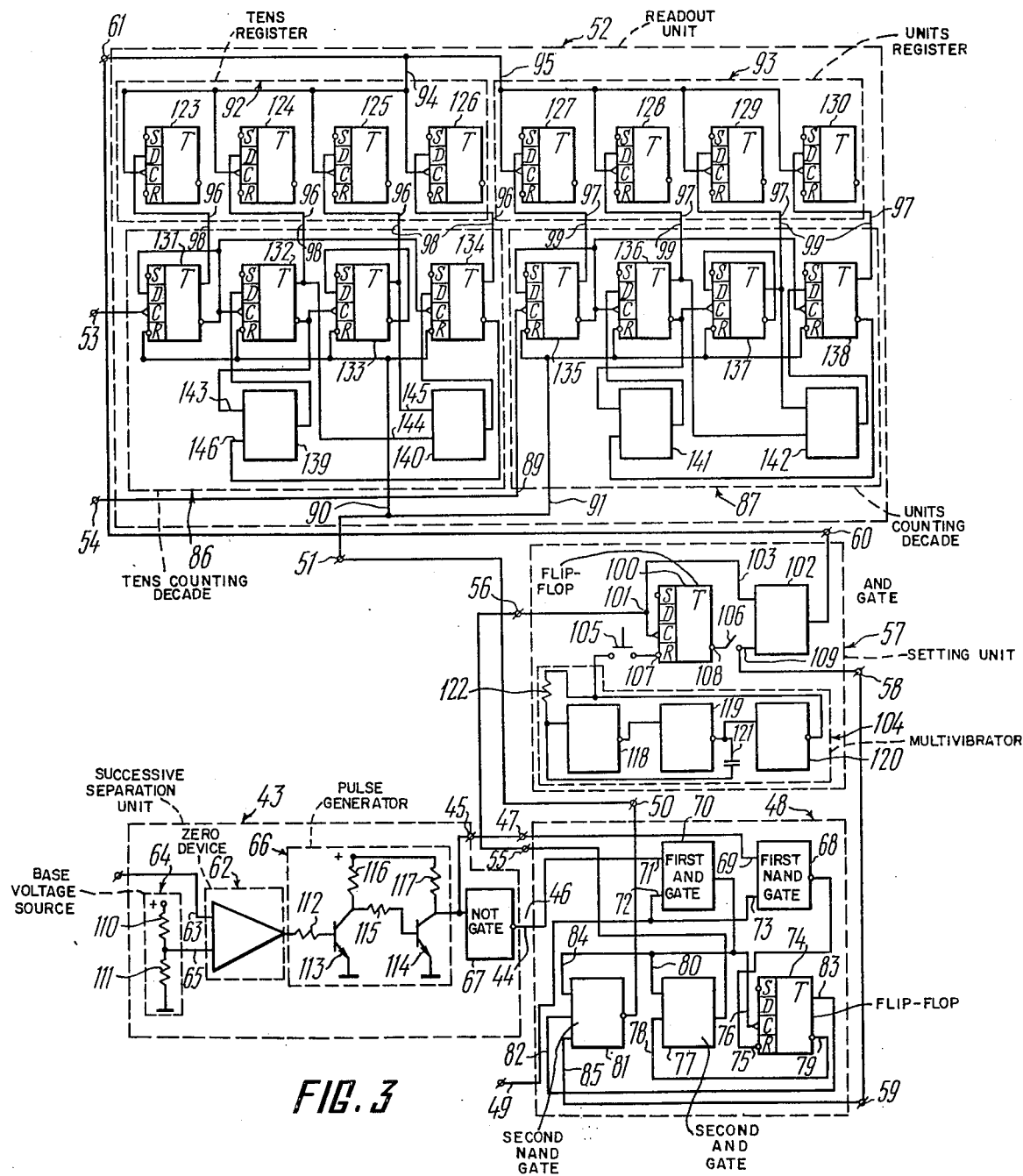
FIG. 3 is an electrical schematic diagram of the proposed device, according to the invention.
Figure 4:
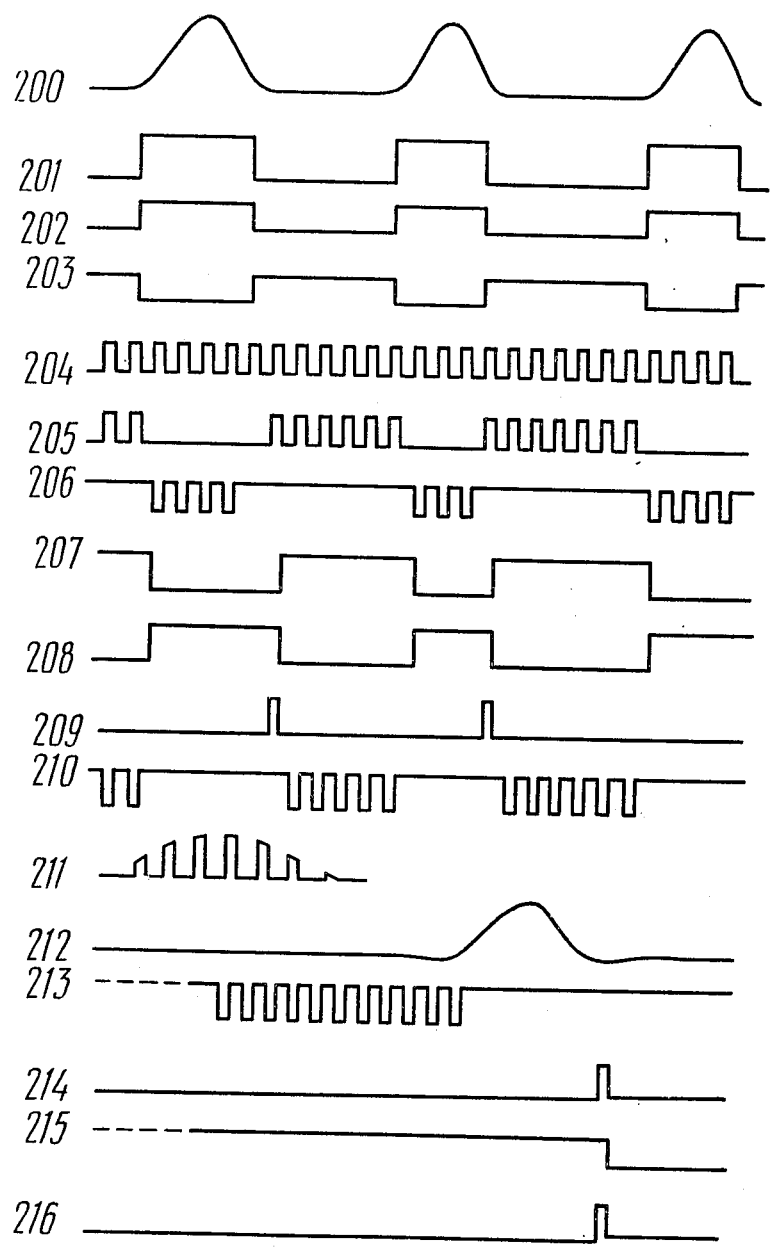
FIG. 4 are time diagrams of output and input voltages of the various units and elements of the proposed device, according to the invention.

FIG. 4 is supplied for better understanding of the principle of operation of a device for measuring single and multiple impact impulses of FIGS. 1, 2 and 3.

Referring to FIG. 4, it shows: a normalized output voltage 200 of the filter 3 in measuring multiple impact pulses; rectangular voltage 201 pulses at the output of the zero device of the unit 43 for successive separation of impact pulses time intervals and a pause; pulses of an output voltage 202 of the pulse generator 66 of the separation unit 43; pulses of an output voltage 203 of the NOT gate 67 of the separation unit 43; a sequence of high-frequency pulses 204 at the input 49 of the unit 48 for separation of a first and a group of further pulses from a train of high-frequency pulses filling a pause; pulses of an output voltage 205 of the AND gate 70 of the separation unit 48; pulses of an output voltage 206 of the NAND gate 68 of the separation unit 48; pulses of a voltage 207 at the inverting output 83 of the flip-flop 74 of the separation unit 48; pulses of a voltage 208 at the output 79 of the flip-flop 74 of the separation unit 48; pulses of a transcription voltage 209 at the output 55 of the separation unit 48; pulses of a reset voltage 210 at the output 50 of the separation unit 48; pulses of a voltage 211 at the adjustment input 107 of the flip-flop 100 of the unit 57 for setting operational modes for measuring single and multiple impact pulses; a normalized voltage 212 of an electrical signal corresponding to a single impact pulse at the output of the filter 3; pulses of a reset voltage 213 at the output 55 of the separation unit 48; a pulse of a transcription voltage 214 at the input 56 of the mode setting unit 57; a voltage 215 at the output 108 of the flip-flop 100 of the mode setting unit 57; and a pulse of a transcription voltage 216 at the output 60 of the mode setting unit 57.

A device for measuring single and multiple impact impulses operates, according to the invention, in the following way.

When a measured impact pulse is absent at the output of the converter 1 (FIG. 1), the output voltage 200 (FIG. 4) of the filter 3 is equal to zero. The output voltage 201 of the zero device 62 (FIGS. 2 and 3) employing the operational amplifier is negative. The voltage 202 (FIG. 4) at the output of the pulse generator 66 (FIGS. 2 and 3), employing two transistor switches, which are the transistors 113 and 114, arranged in a circuit with a common emitter matching the output of the zero device 62 and inputs of the following gates 67 and 68, is equal to zero, whereas the voltage 203 (FIGS. 2 and 3) at the output of the NOT gate 67 is positive.

The voltage at the input 71 of the AND gate 70 is consequently positive, whereas at the input 69 of the NAND gate 68 the voltage is equal to zero.

The high-frequency pulses 204 (FIG. 4) from the output 21 (FIGS. 2 and 3) of the unit 5 for measuring of the peak value of impact pulses, which is the output 18 of the base frequency generator 15 of the measuring unit, is supplied simultaneously to the inputs 72 and 73 of said gates 70, 68.

Pulses of the voltage 205 (FIG. 4) appear at the output of the AND gate 70, whereas the positive voltage 206 (FIG. 4) remains at the output of the NAND gate 68 (FIGS. 2 and 3). The flip-flop 74 (FIGS. 2 and 3) of the separation unit 48 is set. The inputs 82 and 84 of the NAND gate 81 are presented respectively with the positive voltage 207 (FIG. 4) from the output 83 (FIGS. 2 and 3) of the flip-flop 74 and pulses of the voltage 205 (FIG. 4) from the output of the AND gate 70 (FIGS. 2 and 3). It should be noted that in measuring multiple impact pulses the contact 106 of the separation unit 48 is open and, consequently, pulses of the reset voltage 210 (FIG. 4) appear at the output of the NAND gate 81.

The reset pulses 210 are presented to the reset inputs 35 (FIGS. 1, 2, 3) and 51 respectively of the unit 5 for measuring the peak value of an impact pulse and the unit 52 for readout of information on single and multiple impact pulses. The registers 30 and 24 of the measuring unit 5 and the counting decades 86 and 87 of the information readout unit 52 are reset and all units for measuring single and multiple impact pulses are prepared for the beginning of measurements.

When the electrical signal appears at the output of the converter 1 (FIG. 1), that is when an impact impulse is received the amplifier 2 and the filter 3 respectively amplify and filter the signal to the level of the normalized voltage 200 (FIG. 4).

When reset pulses pass, the output voltage of the digital-analog converter 40 (FIG. 2) of the measuring unit 5 is equal to zero. The normalized output voltage of the filter 3 (FIG. 1) is applied to the inputs 6 and 7 of the tens comparator 8 and the units comparator 9 of the measuring unit 5 respectively. If the value of the normalized voltage 200 (FIG. 4) is high enough, a positive potential appears at the outputs of both comparators 8 and 9 and pulses from the base frequency generator 15 appear at the output of the AND gate 11 to be further fed via the OR gate 27 to the input 29 of the tens register 30 and simultaneously to the input 53 of the unit 52 for readout of information on single and multiple impact pulses and, consequently, to the input 88 of the tens counting decade 86 of the readout unit 52. Pulses from the base frequency generator 15 cannot pass through the AND gate 20 to the input 23 of the units register 24 of the measuring unit 5 due to the INHIBIT gate 13.

The output voltage of the digital-analog converter 40 begins a stepwise increase and, consequently, the number of pulses fed to the input 29 of the tens register 30 of the measuring unit 5 and to the input 88 of the tens counting decade 86 of the readout unit 52 starts to grow.

When the output voltage of the digital-analog converter 40 reaches a certain level, a zero potential will appear at the output of the tens comparator 8 of the measuring unit 5, high-frequency pulses will not be fed to the input 29 of the tens register 30, and the INHIBIT gate 13 will let a positive potential from the output of the units comparator 9 to the input 22 of the AND gate 20 and to the input 23 of the units register 24 of the measuring unit 5, as well as to the input 54 of the information readout unit 52. Pulses from the base frequency generator will, consequently, be fed to the input 89 of the units counting decade 87 of the readout unit 52.

As soon as the voltage at the output of the digital analog converter 40 becomes equal to the maximum value of the voltage 200 (FIG. 4) at the output of the filter 3 (FIG. 1), zero potential is formed at the output of the units comparator 9 (FIG. 2) and high-frequency pulses cease going to the input of the units register 24 of the measuring unit 5 and to the input 89 of the units counting decade 87 of the readout unit 52.

The peak value of an impact pulse is in this way measured by the measuring unit 5 and information on the peak value of an impact pulse is read out by the readout unit 52.

The counting decades 86 and 87 of the readout unit 52 are made so that pulses fed to their inputs 88 and 89 are counted in the code $1 \times 2 \times 4 \times 8$.

While the measured impact pulse advances, the voltage 201 (FIG. 4) at the output of the zero device 62 (FIGS. 2 and 3) of the separation unit 43 becomes positive and the voltages 202 (FIG. 4) and 203 at the outputs of the pulse generator 66 (FIGS. 2 and 3) and the NOT gate 67 of the separation unit 43 become respectively positive and equal to zero. The pulse voltage 206 FIG. 4) appears at the output of the NAND gate 68 and the flip-flop 74 (FIGS. 2 and 3) of the separation unit 48 is reset. The positive and zero voltages 208 and 207 (FIG. 4) are established at the outputs 79 and 83 respectively of the flip-flop 74.

When the measured impact pulse has passed, the negative voltage 201 (FIG. 4), the zero voltage 202, and the positive voltage 203 appear respectively at the output of the zero device 62 (FIGS. 2 and 3), at the output of the pulse generator 66 and at the output of the NOT gate 67. High-frequency pulses 204 (FIG. 4) from the output 21 (FIGS. 2 and 3) of the unit 5 for measuring the peak value of an impact pulse appear at the output of the AND gate 70 (FIGS. 2 and 3). The flip-flop 74 of the separation unit 48 is reset by the back edge of the first high-frequency pulse from the output of the AND gate 70. In this way the output of the AND gate 77 will have only one, first pulse from a train of high-frequency pulses filling the pause between two successive impact pulses. This pulse is the pulse of the transcription voltage 209 (FIG. 4), which is transferred due to the open contact 106 (FIGS. 2 and 3) of the unit 57 for setting operational modes for measuring single and multiple impact pulses to the output of the AND gate 102 and is further fed to the transcription input 51 of the unit 52 for readout of information on single and multiple impact pulses. The transcription pulse is supplied to the C-inputs of the flip-flops 123 – 130 employed by the tens and units of the flip-flops 123 – 130 employed by the tens and units registers 92 and 93 of the information readout unit 52. Voltages from the outputs of respective flip-flops 131 – 138 of the tens and units counting decades 86 and 87 of the readout unit 52 are fed to respective D-inputs of the flip-flops 123 – 130. After the transcription pulse is passed, a voltage appears at the outputs of the flip-flops 123 – 130 of the memory registers 92 and 93, which corresponds to the voltages at the outputs of the flip-flops 131 – 138 of the counting decades 86 and 87 of the readout unit 52.

Thus, the information on the peak value of an impact impulse recorded in the tens and units registers 30 and 24 of the unit 5 for measuring the peak value of impact impulses and in the tens and units counting decades 86 and 87 of the readout unit 52 is transcribed into the memory registers 92 and 93 of the readout unit 52. The information accumulated in the memory registers 92 and 93 can be further supplied to computers, digit printing devices and displays.

As it has been described above, after the transcription pulse passes, the flip-flop 74 of the unit 48 for separation of the first pulse and a group of further pulses from a train of high-frequency pulses filling a pause is reset and the positive voltage 207 (FIG. 4) is fed to the input 82 of the NAND gate 81 of the separation unit 48. Due to the open contact 106 (FIGS. 2, 3) of the unit 57 for setting operational modes for measuring single and multiple impact pulses reset pulses of the voltage 210 (FIG. 4) appear at the output of the NAND gate 81 of the separation unit 48. This voltage 210 is fed to the input 35 (FIGS. 2, 3) of the unit 5 for measuring the peak value of impact pulses and to the input 51 of the unit 52 of readout of information on single and multiple impact pulses and further on to the inputs of the R flip-flops 131 – 138 of the tens and units counting decades 86 and 87 of the readout unit 52. The pulsed reset voltage 204 (FIG. 4) resets the registers 30 (FIGS. 2, 3) and 24 of the measuring unit 5 and the counting decades 86 and 87 of the readout unit 52.

In this way the memory tens and units registers 92 and 93 (FIGS. 2, 3) of the readout unit 52 retain the information on the peak value of the measured impact pulse, whereas the entire device for measuring single and multiple impact pulses is ready to measure a new impact pulse.

When a new impact impulse appears, the whole cycle of measuring is repeated as described above.

When a single impact pulse is to be measured, the contact 106 of the unit 57 for setting operational modes for measuring single and multiple impact pulses is closed. Either positive or zero voltage appears at the inverting output 108 of the flip-flop 100 of the unit 57. Before measuring, the contact 105 of the mode setting unit 57 is closed and the pulsed voltage 211 (FIG. 4) from the output of the multivibrator 104 (FIGS. 2, 3) of the mode setting unit is fed to the input 107 of the flip-flop 100 of the mode setting unit 57 and either resets the flip-flop 100 of the unit 57 or confirms its being already reset. In this way the positive voltage 215 (FIG. 4) appears at the inverting output 108 of the flip-flop 100 of the mode setting unit 57. This voltage 215 is supplied to the input 85 (FIGS. 2, 3) of the NAND gate 81 of the unit 48 for separation of a first pulse and a group of further pulses from a train of high-frequency pulses filling a pause and the pulsed reset voltage is fed to the inputs 35 and 51 of the unit 5 for measuring the peak value of impact pulses and the unit 52 for readout of information on single and multiple impact pulses and respectively gets the device ready for measuring.

The peak value of a single impact pulse is measured by the proposed device just as described above in the example for measuring multiple impact pulses. When the measured impact pulse passes through, a pulse of transcription voltage is fed to the input 101 (FIG. 3) of the flip-flop 100 of the setting unit 57 and resets the flip-flop 100 (FIGS. 2, 3) of the unit 57. A pulse of the transcription voltage 216 (FIG. 4) appears at the output of the AND gate 102 of the setting unit 57 and the information on the peak value of the measured impact pulse is fed to the memory registers 92 and 93 (FIGS. 2, 3) of the readout unit 52. After the transcription pulse passes the flip-flop 100 of the setting unit 57 is set and further measurements and transcription become impossible until the contact 105 of the setting unit 57 is closed again.

The device, which operation and circuitry has been described above, undoubtedly increases the quality of measurements of impact pulses. In particular, the principles of getting the device ready for measurements in the pause and changing the parameters of an impact pulse while it advances increase its operating speed and accuracy of measurements of impact pulses, since the circuits intended to get the device ready for measurements affect in no way its operation while the impact pulse advances. Employment of additional memory units not only retains the high-speed measurement achieved by the aforementioned principles but ensure further transfer of the information on the peak value of impact pulses to display, digit printing and computers.

What is claimed is:

1. A digital device for measuring single and multiple impact impulses comprising: a converter for converting impact impulses into electrical signals; an amplifier of electrical signals, the input of which is connected to an output of said converter; an electrical signal filter, the input of which is connected to an output of said amplifier; a measuring unit, for measuring the peak value of impact pulses and having inputs and outputs, a first input of which is connected to an output of said filter; a tens comparator of said measuring unit having inputs; a units comparator of said measuring unit having inputs, a first input of said units comparator being connected to a first input of said tens comparator and together serve as said first input of said measuring unit; a successive separation unit, for successive separation of impact pulse time intervals and pauses therebetween, and having an input connected to said first input of said measuring unit and outputs; a base frequency generator of said measuring unit having an output; a separation unit, for separation of a first transcription pulse and a group of further reset pulses from a train of high-frequency pulses within a given interval between two successive impact pulses having inputs and outputs, a first input and a second input of which are connected to a first output and a second output of said successive separation unit and a third input of which is connected to a first output of said base frequency generator, which serves as a first output of said measuring unit; a tens register of said measuring unit having inputs and outputs; a units register of said measuring unit having inputs and outputs; gate means of said measuring unit providing electrical connection of the output of said tens comparator, the output of said units comparator and said outputs of said base frequency generator with said inputs of said tens and units registers; a reset line of said tens and units registers; a digital-analog converter of said measuring unit having a group of inputs connected to a group of outputs of said tens register and of outputs of said units register and having an output connected to a second input of a group of inputs connected to a group of said tens comparator and of said units comparator; a readout unit, for readout of information on single and multiple impact pulses, having inputs, a first and a second input being connected to the input of said tens register and of said units register, which serve respectively as a second and a third output of said separation unit and to said reset line which serves as a second input of said measuring unit; a setting unit, for setting operational modes for measuring single and multiple impact pulses, having an input connected to a second output of said separation unit, a first output connected to a fourth input of said separation unit and a second output connected to a fourth input of said readout unit, said transcription pulses being effective to transfer the measured peak value information of the inpact pulses to storage means prior to a resetting of said measuring means by said resetting pulses, and the measurement of a next succeeding impact pulse, whereby the device is reset and prepared for further measurements in the interval between pulses.

2. A device as claimed in claim 1 comprising: a zero device of said successive separation unit having inputs, a first input being said input of said successive separation unit; a base voltage source of said successive separation unit having an output connected to a second input of said zero device; a pulse generator of said successive separation unit having an input connected to an output of said zero device and an output which is said second output of said successive separation unit; a NOT gate of said successive separation unit having an input connected to said output of said pulse generator and an output which is said first output of said successive separation unit.

3. A device as claimed in calim 2 comprising: a first NAND gate of said separation unit having inputs, a first input being said second input of said separation unit; a first AND gate of said separation unit having inputs, a first input being said first input of said separation unit and a second input being connected to a second input of said first NAND gate and srving as said third input of said separation unit; a flip-flop of said separation unit having an adjustment input connected to an output of said first NAND gate, a dynamic input connected to an output of said first AND gate and outputs; a second AND gate of said separation unit having a inputs, a first input being connected to an inverting output of said flip-flop, a second input being connected to the output of said first AND gate and an output being said second output of said separation unit; a second NAND gate of said separation unit having, a first input being connected to a first output of said flip-flop, a second input being connected to the output of said first AND gate, a third input being said fourth input of said separation unit and an output being said first output of said separation unit.

4. A device as claimed in claim 3 comprising a tens counting decade of said readout unit having a counting input serving as said first input of said readout unit and a reset input; a units counting decade of said readout unit having a counting input serving as said second input of said readout unit and a reset input connected to said reset input of said tens counting decade and serving together with said reset input of said tens counting decade as said third input of said readout unit; a tens register of said readout unit having a group of inputs connected to a group of outputs of said tens counting decade; a units register of said readout unit having a group of inputs connected to a group of outputs of said units counting decade and a transcription input, which is connected to a transcription input of said tens register and serves together with said transcription input of said tens register as the fourth input of said readout unit.

5. A device as claimed in claim 4 comprising: a flip-flop of said setting unit having a dynamic input, which serves as said input of said setting unit, and an adjustment input; an AND gate of said setting unit having inputs, a first input being connected to said dynamic input of said flip-flop, and an output which serves as said second output of said setting unit; a multivibrator of said setting unit; a group of normally open contacts of said setting unit, a first contact electrically connecting an output of said multivibrator to said adjustment input of said flip-flop and a second contact electrically connecting an output of said flip-flop to a second input of said AND gate which serves as said first output of said setting unit, said pulse of transcription pulses being fed to the dynamic input of said flip-flop of said setting unit and resets said flip-flop, said transcription pulses appearing at the output of the AND gate of said setting unit and the information on the peak value of the measured impact pulse is fed to the tens and units registers of the readout unit, after the transcription pulse passes the flip-flop of said setting unit, said setting unit is set and further measurements and transcription are prevented until said first contact of the setting unit is closed only when said second contact is closed in the single impact pulse measurement mode of said setting unit.

6. A device as claimed in claim 5 wherein said gate means of said measuring unit includes: a first AND gate having a first and a second input and an output, said first input being connected to a second output of said base frequency generator of said measuring unit, said second input being connected to said output of said tens comparator of said measuring unit; an INHIBIT gate having a first and a second input and an output, said first input being connected to said output of said tens comparator of said measuring unit and to said second input of said first AND gate, said second input being connected to said output of said units comparator of said measuring unit; a second AND gate having a first and a second input and an output, said first input being connected to said first output of said base frequency generator of said measuring unit, said second input being connected to said output of said INHIBIT gate, said output being connected to said first input of said units register of said measuring register; an OR gate having a first and a second input and an output, said first input being connected to a single output of said units register of said measuring unit, said second input being connected to said output of said first AND gate, said output being connected to said first input of said tens register of said measuring unit; said reset line being connected to a reset input of said tens register of said measuring unit to and a reset input of said units register of said measuring unit; when the signal passes through, a pulse transcription voltage is fed to the dynamic input of said flip-flop of said setting unit and resets said flip-flop, said pulse of the transcription voltage appears at the output of the AND gate of said setting unit and the information on the peak value of the measured impact pulse is fed to the tens and units registers of the readout unit, after the transcription pulse passes the flip-flop of said setting unit, the setting unit is set and further measurements and transcriptions are prevented until said first contact of the setting unit is closed.

* * * * *

UNITED STATES PATENT OFFICE
CERTIFICATE OF CORRECTION

PATENT NO. : 4,055,842
DATED : October 25, 1977
INVENTOR(S) : Alexandr Sergeevich Yakshin, et al.

It is certified that error appears in the above-identified patent and that said Letters Patent are hereby corrected as shown below:

Column 5, line 26, before "zero" add --voltage level comparator or--.

Signed and Sealed this

Eighteenth Day of April 1978

[SEAL]

Attest:

RUTH C. MASON
Attesting Officer

LUTRELLE F. PARKER
Acting Commissioner of Patents and Trademarks